United States Patent [19]

Robe

[11] 4,074,205

[45] Feb. 14, 1978

[54] INPUT STAGE FOR FAST-SLEWING AMPLIFIER

[75] Inventor: Thomas Joseph Robe, Union, N.J.

[73] Assignee: RCA Corporation, New York, N.Y.

[21] Appl. No.: 775,863

[22] Filed: Mar. 9, 1977

[51] Int. Cl.² ............................................. H03F 3/45
[52] U.S. Cl. .................................. 330/257; 330/259; 330/261; 330/69; 328/128
[58] Field of Search .................... 328/128; 330/22, 26, 330/28, 30 D, 69

[56] References Cited
U.S. PATENT DOCUMENTS 3,668,538  6/1972  Hearn ............................ 330/30 D X

Primary Examiner—Lawrence J. Dahl

Attorney, Agent, or Firm—H. Christoffersen; Allen L. Limberg

[57] ABSTRACT

Each half of a differential-input amplifier stage has an input terminal connected to the emitter electrode of a transistor. Resistances are provided for sensing the flow of current through the principal conduction path of each transistor. Output signal current for the stage is taken from the collector of at least one of the transistors and applied to the input of a following one of a cascade connection of amplifier stages. Voltage comparator means sense the drop in potential across one of the resistances caused by reduction of current in one half of the diffferential-input amplifier to increase the current available to the other half. This increases the output signal current available to charge or to discharge capacitance in the stage(s) cascaded after the diffferential-input amplifier, increasing the slew rate of the cascade.

21 Claims, 6 Drawing Figures

INPUT STAGE FOR FAST-SLEWING AMPLIFIER

The present invention relates to an input stage for an operational amplifier that provides for fast slewing without concomitant increase in input offset current error.

In a conventional operational amplifier, the input stage is followed in cascade by driver and output stages. A feedback capacitor is used in a feedback connection of the output circuit of the driver stage to its input circuit so the stage operates as an integrator with a twenth db increase in amplifier response per decade increase of signal frequency. The slew rate of the operational amplifier — that is, the speed with which it can follow a step in input signal — is limited by the amount of current available from the input stage to charge or to discharge the feedback capacitor.

In many prior art operational amplifiers, the input stage is operated with high quiescent current to increase the current available for charging or discharging the capacitor. Increased quiescent current levels in the input stage undesirably tend to increase the input currents demanded from the circuitry preceding the operational amplifier and to increase the input offset error of the operational amplifier when it is provided with direct-coupled overall feedback.

W. E. Hearn in U.S. Pat. No. 3,668,538 issued June 6, 1972, and entitled "Fast Slewing Operational Amplifier" discloses an improved input stage. In the Hearn input stage the transconductance of the input stage increases exponentially with applied input signal current, to make available almost boundless current for charging or discharging the feedback capacitor. This almost boundless current provides for greatly increased slew rate, but at the same time greatly increases the likelihood of saturation occurring in the transistors in the driver and output stages, which can undesirably slow the settling time of the operational amplifier — that is, the time for normal linear operation to be re-established after fast slewing.

The present invention is embodied in an amplifier input stage from which increased current is available to a subsequent stage during rapid input signal excursions, but which increased current has well-defined bounds so as to avoid adverse effect upon amplifier settling time.

Figure 1:
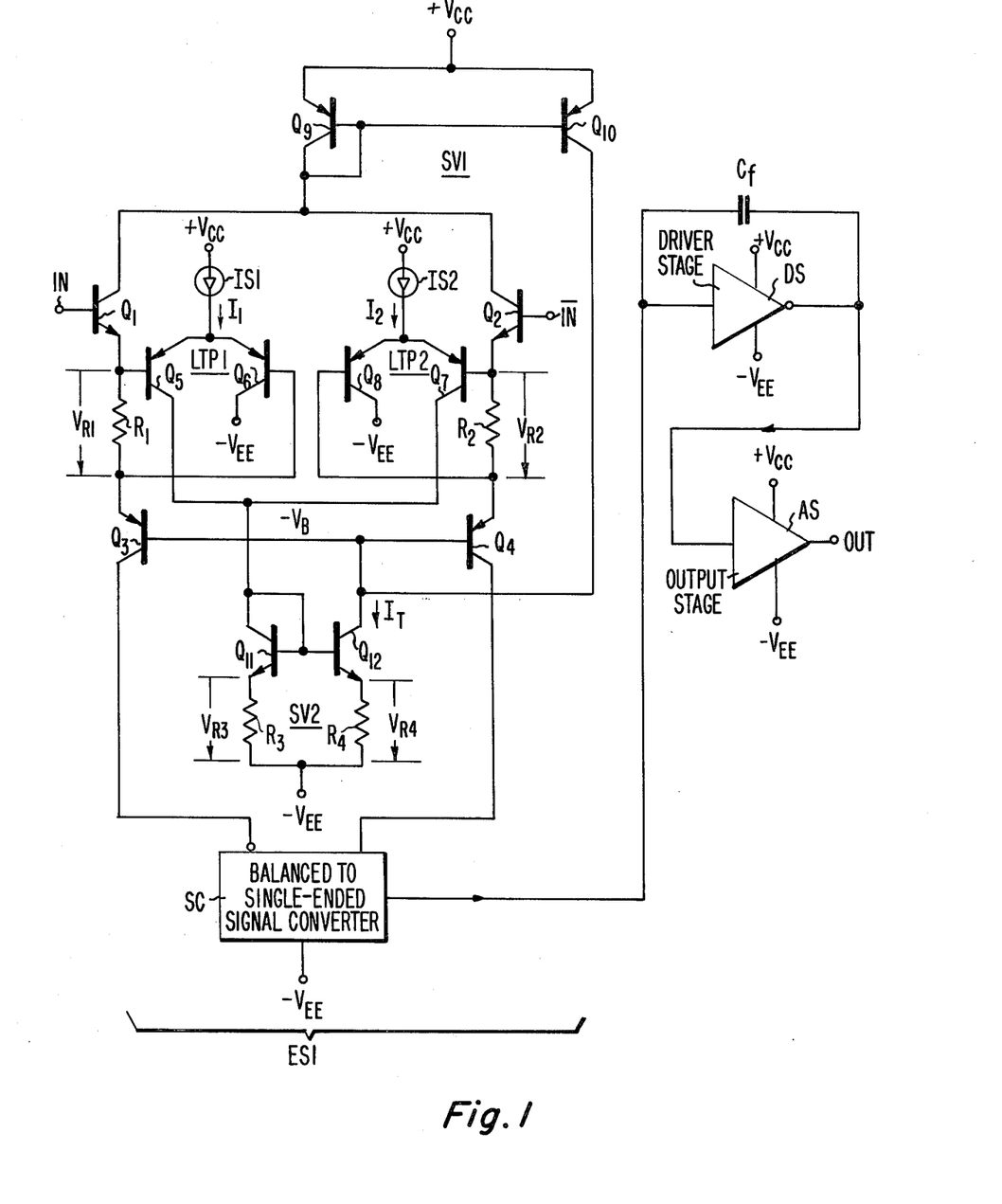
FIG. 1 is a schematic diagram, partially in block form of a fast-slewing operational amplifier with its input stage constructed according to the present invention.

The FIG. 1 operational amplifier is of a type suited to monolithic integrated construction. The operational amplifier is arranged to be energized from a relatively negative operating voltage $-V_{EE}$ and a relatively positive operating voltage $+V_{cc}$, as compared to the quiescent potentials applied to its non-inverting and inverting input terminals labelled IN and $\overline{\text{IN}}$, respectively. IN and $\overline{\text{IN}}$ are at the base electrodes of transistors $Q_1$ and $Q_2$, respectively, in the input stage ES1 of the operational amplifier. In the input stage ES1, the emitters of NPN transistors $Q_1$ and $Q_2$ are connected through resistors $R_1$ and $R_2$, respectively, to the emitters of PNP transistors $Q_3$ and $Q_4$, respectively. $Q_3$ and $Q_4$ have their base electrodes connected together and have their collectors connected to a balanced-to-single-ended signal converter SC in which their collector currents are differentially combined to provide an input signal for driver stage DS. SC typically is a current mirror amplifier constructed with NPN master and slave transistors. For differential-mode components of the input signals applied to the input teminals IN and $\overline{\text{IN}}$, $Q_1$ and $Q_2$ function as common-collector amplifiers and $Q_3$ and $Q_4$ function as common-base amplifiers in cascade connection after the common-collector amplifiers $Q_1$ and $Q_2$, respectively. Response to common-mode components of the input signals applied to IN and $\overline{\text{IN}}$ is suppressed in the input signal applied to the driver stage DS by the common-mode rejection of the balanced-to-single-ended signal converter SC.

Quiescent currents in $Q_1$, $Q_2$, $Q_3$ and $Q_4$ are controlled responsive to a current $I_T$ applied to the interconnection between the base electrodes of $Q_3$ and $Q_4$, which is at a potential $-V_B$. The emitter currents $I_{EQ1}$ and $I_{EQ3}$ of $Q_1$ and $Q_3$ are established by the difference between $V_{IN}$ at the non-inverting input terminal IN and $-V_B$ minus the base-emitter offset voltages ($V_{BE}$'s) of $Q_1$ and $Q_3$, all divided by $R_1$, in accordance with Ohm's Law. Similarly, the emitter currents $I_{EQ2}$ and $I_{EQ4}$ of $Q_2$ and $Q_4$ are established by the difference between $V_{\overline{IN}}$ at the inverting input terminal $\overline{\text{IN}}$ and $-V_B$ minus the $V_{BE}$'s of $Q_2$ and $Q_4$, all divided by $R_2$. As $-V_B$ is made more or less negative relative to the potentials $V_{IN}$ and $V_{\overline{IN}}$, the emitter currents $I_{EQ1}$, $I_{EQ2}$, $I_{EQ3}$ and $I_{EQ4}$ increase or decrease, respectively, in magnitude.

The magnitude of the collector currents $I_{CQ1}$ and $I_{CQ2}$ of $Q_1$ and $Q_2$ are a factor $\alpha$, nearly equal to minus unity, times the magnitudes of their respective emitter currents. $I_{CQ1}$ and $I_{CQ2}$ are combined and applied to the input connection of a current amplifier SV1. SV1 is shown as being a conventional current mirror amplifier comprising a master transistor $Q_9$ with Waldhauer collector-to-base feedback and a slave transistor $Q_{10}$, both PNP's. SV1 has its common connection at the emitters of Q9 and $Q_{10}$ connected to $+V_{cc}$ and its output connection at the collector electrode of $Q_{10}$.

This output connection is connected to the interconnection of the base electrodes of $Q_3$ and $Q_4$ to complete a degenerative feedback connection that adjusts $-V_B$ so the collector current $I_{CQ10}$ supplied by $Q_{10}$ is equal to the current $I_T$ demanded from the interconnection minus the usually negligible base currents of $Q_3$ and $Q_4$. ($I_{CQ1}$ + $I_{CQ2}$) must be equal in magnitude to $I_{CQ10}$ divided by the current gain of SV1 in order that $I_{CQ10}$ be supplied. ($I_{EQ1}$ + $I_{EQ2}$) is $-1$ times ($I_{CQ1}$ + $I_{CQ2}$) because of transistor action in $Q_1$ and $Q_2$, and ($I_{EQ1}$ + $I_{EQ2}$) is $-1$ times ($I_{EQ3}$ + $I_{EQ4}$) to satisfy Kirchoff's Law of Currents.

The construction and operation of the input stage ES1 as thusfar described in that of the well-known "741" type of input stage, so called because of its inclusion in many monolithic operational amplifiers bearing type numbers including the sequence 741. Driver stage DS typically is a transresistance amplifier of the inverting type receptive of input signal current from input stage ES1 to supply an output signal potential applied as input signal to an output stage AS. The output stage AS responds to its applied input signal to supply its own output signal at the output terminal OUT, which output signal is a varying potential in the case of a conventional voltage-amplifier type of operational amplifier.

In the FIG. 1 operational amplifier the dominant time constant is established by a Miller feedback capacitor $C_f$ connected between the output and input circuits of the drive stage DS. DS and $C_f$ form an integrator, integrating current from balanced-to-single-ended signal converter SC to provide input signal to output stage AS. It is assumed for the description of the present invention that the slew rate of the FIG. 1 operational amplifier is determined by the current available from the input stage ES1 to charge or discharge $C_f$. To obtain a rapid slew rate, one wishes to increase $I_T$ whenever large differential-mode signal is applied between the input terminals IN and $\overline{\text{IN}}$. Under quiescent conditions, however, one wishes to keep $I_T$ at lower level to reduce the emitter currents $I_{EQ1}$ and $I_{EQ2}$ of $Q_1$ and $Q_2$. This reduces the base currents $I_{BQ1}$ and $I_{BQ2}$ of $Q_1$ and $Q_2$ required to support $I_{EQ1}$ and $I_{EQ2}$ and so reduces input offset error.

In FIG. 1, a current source IS1 supplies a current to the interconnected emitters of PNP current-divider transistors $Q_5$ and $Q_6$. The emitter electrodes of $Q_1$ and $Q_3$ are respectively connected to the base electrode of $Q_5$ and to the base electrode of $Q_6$ and the potential drop $V_{R1}$ appearing across $R_1$ under quiescent conditions (when the potentials at input terminals IN and $\overline{\text{IN}}$ are the same) biases transistor $Q_6$ for substantially greater conduction than $Q_5$. Similarly, a current source IS2 supplies a current to the interconnected emitter electrodes of PNP current-divider transistors $Q_7$ and $Q_8$. The emitter electrodes of $Q_2$ and $Q_4$ are respectively connected to the base electrodes of $Q_7$ and to the base electrode of $Q_8$, and the potential drop $V_{R2}$ appearing across $R_2$ under quiescent conditions biases transistor $Q_8$ to substantially greater conduction than $Q_7$. The collector currents of $Q_5$ and $Q_7$ are inverted and then combined, or combined and then inverted to provide $I_T$. The latter procedure is preferred since the collector currents are readily combined by interconnection between the collector electrodes of $Q_5$ and $Q_7$ to provide a single current for inversion. FIG. 1 shows this interconnection of the collector electrodes of $Q_5$ and $Q_7$ and a current amplifier SV2 that functions as an inverting amplifier for inverting the combined collector currents of $Q_5$ and $Q_7$ to obtain an $I_T$ of proper polarity.

SV2 typically comprises a current mirror amplifier, which may take the form shown in FIG. 1. In FIG. 1, SV2 includes NPN master and slave transistors $Q_{11}$ and $Q_{12}$ and their respective emitter degeneration resistors $R_3$ and $R_4$. In SV2 the conductance of $R_4$ may be related to that of $R_3$ in the same ratio as the collector-current-versus-emitter-to-base voltage ($I_c$ vs. $V_{BE}$) characteristic of $Q_{12}$ is related to that of $Q_{11}$, in which case SV2 will have a constant current gain equal to that ratio. One may prefer, however, for reasons to be explained, to make the ratio of the conductance of $R_4$ to that of $R_3$ larger than the ratio of the $I_c$ vs. $V_{BE}$ characteristic of $Q_{12}$ to that of $Q_{11}$. In such case, SV2 exhibits a current gain $G_2'$ at relatively high input current levels, when the potential drops $V_{R3}$ and $V_{R4}$ across resistors $R_3$ and $R_4$ appreciably exceed the $V_{BE}$'s of $Q_{11}$ and $Q_{12}$, than is larger than the current gain $G_2$ that SV2 exhibits at relatively low input current levels, when $V_{R3}$ and $V_{R4}$ are appreciably smaller than the $V_{BE}$'s of $Q_{11}$ and $Q_{12}$. Other forms of current mirror amplifiers may replace that shown in FIG. 1 and may incorporate modifications to cause them to exhibit different current gains at different levels, and indeed current amplifier SV2 may simply consist of a common-emitter transistor.

Suppose now that the FIG. 1 operational amplifier is connected as a voltage follower with its output terminal OUT directly connected to its inverting input terminal $\overline{\text{IN}}$ and that it is called upon to slew rapidly. This request is in response to the potential $V_{IN}$ at the non-inverting input terminal IN being rapidly changed to be substantially positive compared to $V_{\overline{IN}}$ at the inverting input terminal $\overline{\text{IN}}$. This tends to make $Q_1$ conducting and $Q_2$ non-conducting. Responsive to the increase in $I_{EQ1}$, $V_{R1}$ increases, biasing $Q_5$ for still more reduced conduction. Responsive to the reduction in $I_{EQ2}$, $V_{R2}$ decreases, decreasing to just the base current $I_{BQ7}$ of $Q_7$, if $I_{EQ2}$ is reduced to zero. $Q_7$ is no longer reduced in conduction with respect to $Q_8$, assuming $Q_7$ and $Q_8$ to have similar $I_c$ vs. $V_{BE}$ characteristics. The current $I_2$ supplied by source IS2, which under quiescent conditions flows principally through $Q_8$ and is thus diverted from the input connection of current amplifier SV2, under the rapid slewing conditions flows in substantially increased proportion through $Q_7$ to the input connection of SV2. SV2 responds to demand increased $I_T$.

The degenerative feedback loop previously described that adjusts $I_{CQ10}$ substantially to equal $I_T$ demand, forces $-V_B$ more negative in response to increased $I_T$ demand, substantially increasing the potential $V_{R1}$ across $R_1$ and the current flow therethrough. This substantially increased current flows as increased $I_{EQ3}$ causing $Q_3$ to supply substantially increased collector current $I_{CQ3}$. Balanced-to-single-ended signal converter SC responds to the substantially increased $I_{CQ3}$ to demand substantially increased current from driver stage DS and its Miller feedback capacitor $C_f$, which speeds up the response of the integrator SD and $C_f$ form.

Rapid slewing for the conditions where $V_{IN}$ is suddenly made substantially negative with respect to $V_{\overline{IN}}$, on the other hand, results in $V_{R1}$ being reduced permitting current $I_1$ from IS1 to flow in substantially increased proportion to the input connection of current amplifier SV2 to cause substantially increased $I_T$ demand. The substantially increased $I_T$ demand results in more negative $-V_B$ and in substantially increased $V_{R2}$ and $I_{EQ4}$. The substantially increased $I_{EQ4}$ causes $Q_4$ to supply correspondingly increased collector current $I_{CQ4}$ to balanced-to-single-ended signal converter SC. SC responds to supply substantially increased current to the integrator formed by driver stage DS and its Miller feedback capacitor $C_f$ speeding up the response of the integrator.

To avoid saturation conditions that undesirably lengthen the settling time of the operational amplifier it is desirable that limits be placed on the currents available from the input stage during rapid slewing. In the FIG. 1 operational amplifier, the maximum negative current available from input stage ES cannot exceed the current $I_1$ supplied from current source IS1 multiplied by the current gain $G_2'$ of SV2 that obtains during rapid slewing conditions, divided by the current gain $G_1$ of SV1; the maximum positive current available from input stage ES cannot exceed the current $I_2$ supplied from current source IS2 multiplied by the current gain $G_1$ of SV1. These constraints are imposed by the action of the degenerative feedback loop previously described. Knowing the capacitance the input stage must charge and the rate at which the capacitance must be charged in each direction and assuming convenient values for $G_1$ and $G_2'$, one can determine the required values of $I_1$ and $I_2$.

The quiescent value $I_Q$ of the current flowing through $Q_1$, $R_1$, $Q_3$ and of the current flowing through $Q_2$, $R_2$ and $Q_4$ is larger than the permitted quiescent input current demand by one plus the common-emitter forward current gain of transistors $Q_1$ and $Q_2$. The resistance of each of resistors $R_1$ and $R_2$ is chosen sufficiently larger than the combined internal emitter resistances of the transistors whose emitters connect to obtain the degree of transconductance linearization desired in the input stage $E_S$.

The quiescent value of current $I_Q$ in each half of the input stage is one half the quiescent input current of current amplifier SV1 and is thus one half the quiescent output current of SV1 divided by the current gain $G_1$ of SV1. Since the output current of SV1 is held substantially equal to $I_T$, $I_Q$ is ($\frac{1}{2}$) ($I_T/G_1$). $I_Q$ is ($\frac{1}{2}$) ($I_T/G_1$)$G_2$ times the quiescent input current to current amplifier SV2, which input current is provided by the combined collector currents $I_{CQ5}$ and $I_{CQ7}$ of $Q_5$ and $Q_7$. The currents $I_1$ and $I_2$ supplied from current sources IS1 and IS2, respectively, must be properly apportioned between $Q_5$ and $Q_6$ and between $Q_7$ and $Q_8$, respectively, to provide the quiescent input current to current amplifier SV2 associated with the desired level of $I_Q$. Deciding how this apportionment is to be made determines the quiescent values of $I_{CQ5}/I_{CQ6}$ and $I_{CQ7}/I_{CQ8}$.

The division of current in a long-tailed pair transistor is governed by the potential applied between the base electrodes of the transistors. Derivation of the relationship is from the well-known transistor equation following.

$$V_{BE} = (kT/q)(I_C/AJ_S) \quad (1)$$

wherein $V_{BE}$ is the transistor emitter-to-base potential,
$k$ is Boltzmann's constant,
$T$ is the absolute temperature of the transistor,
$q$ is the charge on an electron,
$I_C$ is the transistor collector current,
$A$ is the effective area of the transistor base-emitter junction, and
$AJ_S$ is the collector current of the transistor when its $V_{BE} = 0$.

The integrated transistors $Q_5$, $Q_6$, $Q_7$, $Q_8$ are assumed to have similar junction profiles and thus similar $J_S$'s and to operate at the same temperature T; $V_{BE}$, $I_C$ and A are subscripted with the reference numeral of the transistor with which they are associated.

$$V_{BEQ5} = (kT/q) \ln (I_{CQ5}/A_{Q5}J_S) \quad (2)$$

$$V_{BEQ6} = (kT/q) \ln (I_{CQ6}/A_{Q6}J_S) \quad (3)$$

Dual identity 4 can be written applying Ohm's Law and Kirchoff's Law of Voltages.

$$V_{R1} = I_Q R_1 = V_{BEQ6} - V_{BEQ5} \quad (4)$$

$$(A_{Q5}/A_{Q6}) = (I_{CQ5}/I_{CQ6}) \exp (q I_Q R_1/kT) \quad (5)$$

By similar derivation the value of $A_{Q7}/A_{Q8}$ can be shown to be as set forth in equation 6, following.

$$(A_{Q7}/A_{Q8}) = (I_{CQ7}/I_{CQ8}) \exp (q I_Q R_2/kT) \quad (6)$$

In the design procedure, then, usually one will adjust the $A_{Q5}/A_{Q6}$ and $A_7/A_8$ ratios to accomodate the previous design choices.

While the operation of the FIG. 1 input stage ES1 can be described considering the long-tailed pair configuration LTP1 comprising $Q_5$, $Q_6$, IS1 and the long-tailed pair configuration LTP2 comprising $Q_7$, $Q_8$, IS1 as being controlled current dividers, one may alternatively consider LTP1 and LTP2 as voltage comparators. LTP1 compares the voltages at the ends of $R_1$ to each other to apply a relatively small current to the input connection of current ampifier SV2 when their difference $V_{R1}$ is substantial responsive to conduction of $Q_1$, and a relatively large current to SV2 when the voltages at the ends of $R_1$ are substantially alike responsive to substantially reduces conduction of $Q_1$. LTP2 compares the voltages at the ends of $R_2$ to each other to apply a relatively small current to the input connection of current amplifier SV2 when their difference $V_{R2}$ is substantial, responsive to conduction of $Q_2$, and a relatively large current to SV2 when the voltages at the ends of $R_1$ are substantially alike, responsive to substantially reduced conduction of $Q_2$. Note that decreased conduction of $Q_1$ is responsible for increased availability of current to $Q_2$ and $Q_4$ and that decreased conduction of $Q_2$ is responsible for increased availability of current to $Q_1$ and $Q_3$.

Figure 2:
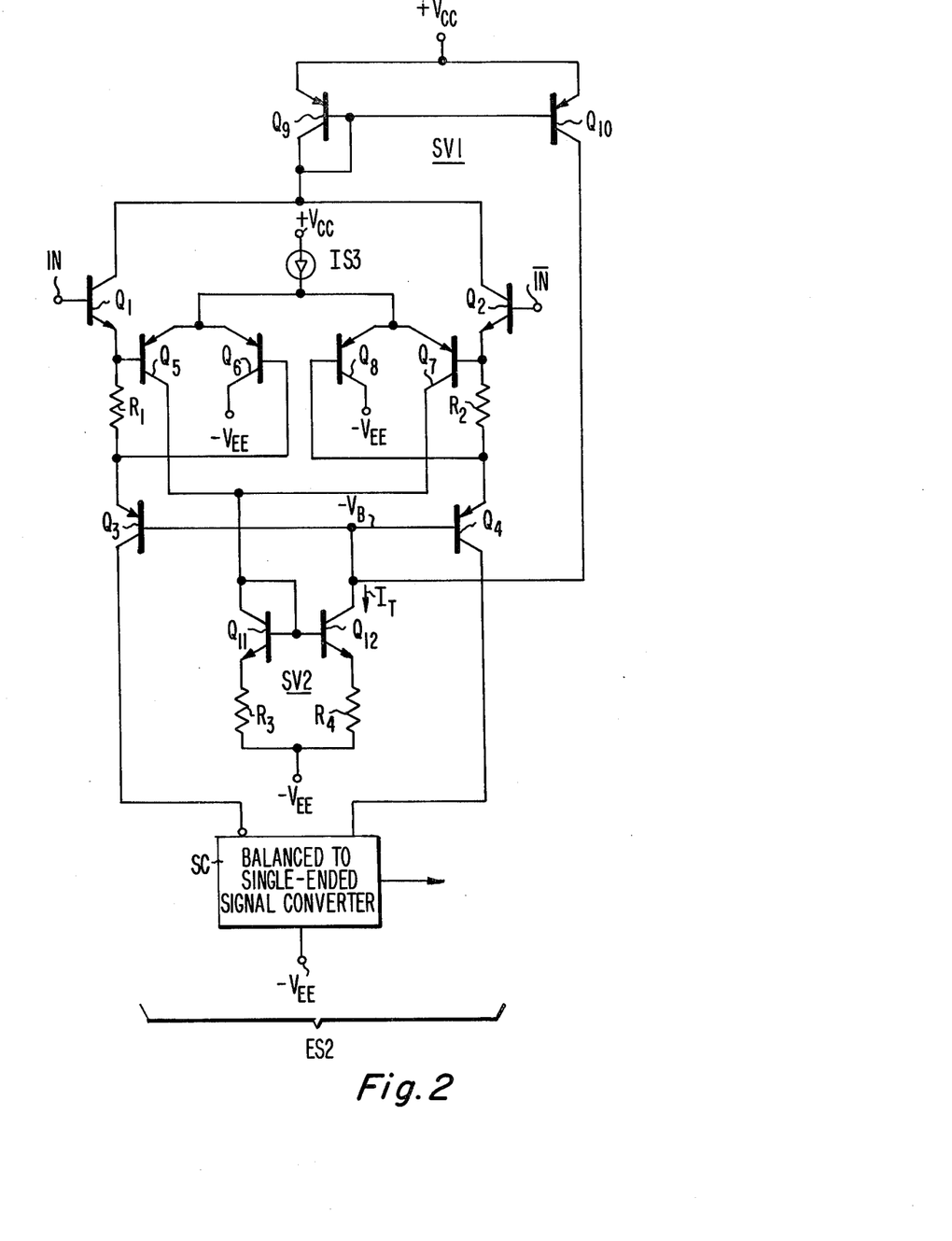
FIG. 2 is a schematic diagram of an alternative operational amplifier input stage that embodies the present invention.

FIG. 2 shows an input stage ES2 that may be advantageously used in place of ES1. The ES2 input stage uses a single current source IS3 to supply current to an interconnection of all the emitters of $Q_5$, $Q_6$, $Q_7$ and $Q_8$. Under quiescent conditions, if the current supplied by IS3 in FIG. 2 is twice as large as each of the currents supplied by IS1 and IS2 in FIG. 1, the operational amplifier input stages in FIGS. 1 and 2 have substantially corresponding current flows and potentials in the corresponding portions of the rest of their respective circuitry. During rapid slewing, however, rather than just substantially all of the current from IS1 or IS2 being available for application to the input connection of SV2, substantially all the current from IS3 is available. So an operational amplifier using the ES2 input stage has twice the slew rate capability of the FIG. 1 operational amplifier for similar quiescent current levels (and, thus, for similar input offset current errors).

Figure 3:
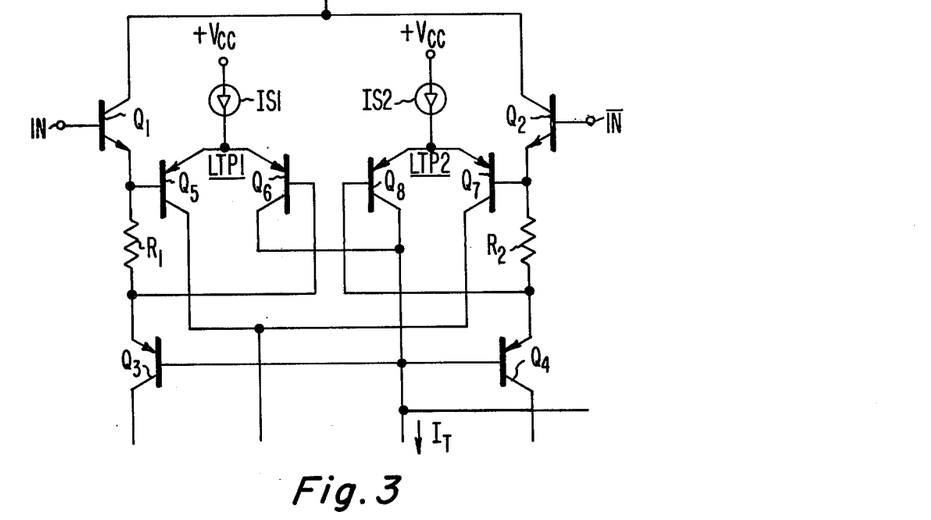
FIGS. 3 and 4 are schematic diagrams of modifications of the input stages shown in FIGS. 1 and 2, respectively, to improve the ratio of current available during rapid slewing to quiescent current.
Figure 4:
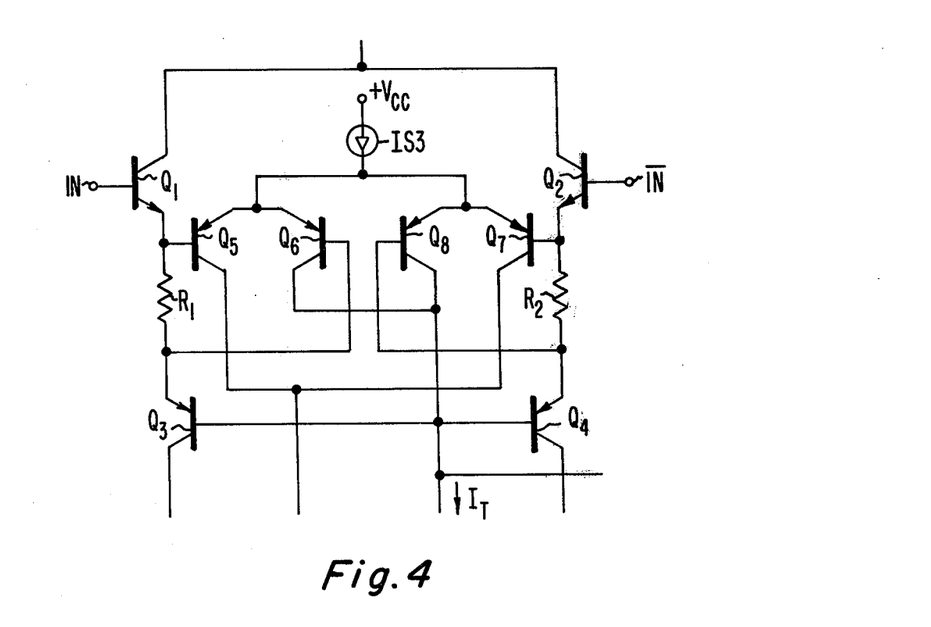

As shown in FIG. 3, one can modify the FIG. 1 input stage ES1 to apply the collector currents of $Q_6$ and $Q_8$ to supply a portion of $I_T$ under quiescent conditions, providing that the current gain $G_2$ of current amplifier SV2 is large enough that $I_T$ exceeds the collector currents of $Q_6$ plus $Q_8$, so that the degenerative feedback connection may demand collector current of $Q_{10}$. FIG. 4 shows similar modification of the FIG. 2 input stage ES2. These modifications increase the current available for application to the driver stage DS under rapid slewing conditions, as compared to $I_Q$.

Figure 5:
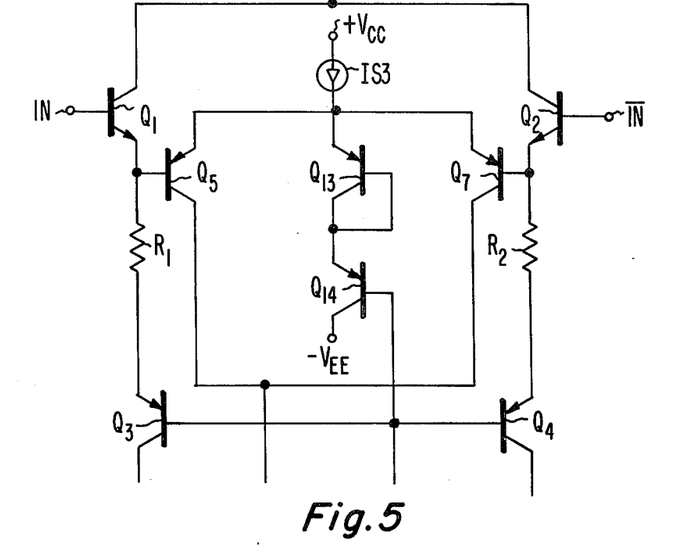
FIGS. 5 and 6 are schematic diagrams of alternative connections of the input stages as shown in FIGS. 2 and 4.
Figure 6:
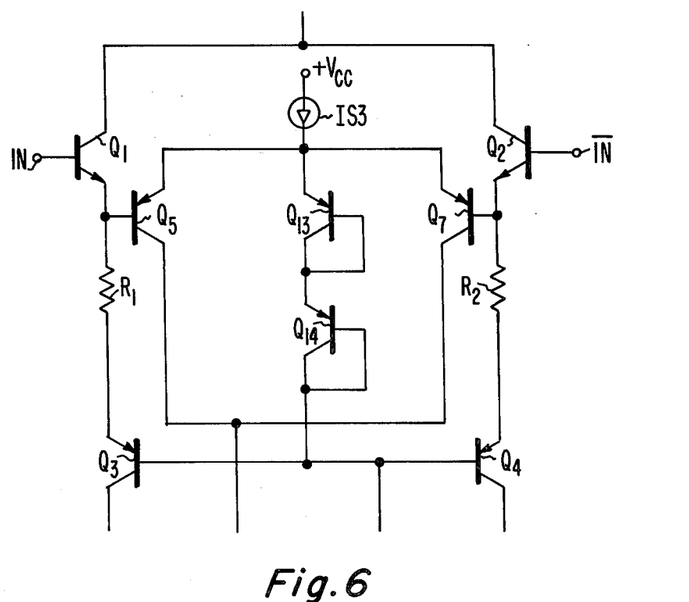

One can modify the input stage ES2 to compare the potentials at the ends of $R_1$ and those at the ends of $R_2$ indirectly as shown in FIG. 5 or FIG. 6, and similar modifications can be made to input stage ES1.

Certain types of current sources lend themselves particularly well for use as IS1 and IS2 in the FIG. 1 and 3 configurations, or as IS3 in the FIGS. 2, 4, 5 and 6 configurations. These current sources are those having currents that depend upon temperature in such a way that applied in some fraction to resistor $R_1$ or $R_2$, a voltage drop proportional to the absolute temperature of the transistors results. The use of such current sources reduced the effect of temperature upon the ratio of current available from the input stage during slewing to the quiescent current levels in the input stage, since potentials drops across $R_1$ and $R_2$ so proportional to absolute temperature provide for temperature-independent current division between $Q_5$ and $Q_6$ and between $Q_7$ and $Q_8$ when two current sources IS1 and IS2 are used — or between $Q_5$ and $Q_7$ when a single current source IS3 is used.

Representative current sources of the preferred type are described by C. F. Wheatley, Jr. in U.S. Pat. No. 3,629,691 issued Dec. 21 1971, and entitled "Current Source" and by B. Crowle in U.S. Pat. Application Ser. No. 646,954 filed Jan. 7 1976, entitled "Current Regulating Circuits" and assigned, like the present application, to RCA Corporation.

While collector-to-emitter feedback of $Q_1$ and $Q_2$ are used in the "741" type of input stage to adjust the shared base potential of $Q_3$ and $Q_4$ vis-a-vis the quiescent base potentials of $Q_1$ and $Q_2$, adjustment can be made without recourse to the collector-to-emitter feedback of $Q_1$ and $Q_2$, in ways that are compatible with the use of the present invention. For example, where $Q_3$ and $Q_4$ are bipolar transistors as shown, their base potentials may be adjusted by limiting the base currents available to them. The configurations shown in the FIGURES may be modified for this type of operation by omitting current amplifier SV1 and connecting the collectors of $Q_1$ and $Q_2$ directly to $+V_{cc}$ operating voltage. Current sources IS1, IS2 and IS3 may be supplied by the base circuits of bias-supply transistors of the same conductivity type as $Q_3$ and $Q_4$. By arranging for constant emitter currents to be applied to the bias-supply transistors their base circuits will supply currents that are compensated for variations in the common-emitter forward current gain variations of $Q_3$ and $Q_4$. Alternatively, IS1, IS2 and IS3 might supply fixed value currents with $Q_3$ and $Q_4$ being replaced by current mirror amplifier configurations of field effect or bipolar transistors.

Embodiments of the invention are possible in which the placement of the resistors $R_1$ and $R_2$, used to sense the current flowing in the principal conduction paths of $Q_3$ and $Q_4$ differ from those shown in the FIGURES. The FIGS. 1 and 2 configurations may be modified to place the sensing resistors $R_1$ and $R_2$ in the collector circuits of $Q_3$ and $Q_4$ or in the collector circuits of $Q_1$ and $Q_2$, the emitters of $Q_1$ and $Q_3$ being otherwise conncted, and the emitters of $Q_2$ and $Q_4$ being otherwise connected. This may be done, for example, where it is desired to connect the emitters of $Q_1$ and $Q_3$ to each other without intervening impedance and to connect the emitters of $Q_2$ and $Q_4$ to each other without intervening impedance. Placing $R_1$ and $R_2$ into the collector circuits of $Q_1$ and $Q_2$ is particularly attractive inasmuch as the stray capacitances associated with $R_1$, $R_2$, LTP1 and LTP2 need not be charged and discharged to so great an extent as in FIGS. 1 and 2, when large common-mode component variations occur in the input signals applied to the terminals IN and $\overline{\text{IN}}$.

Differential-input amplifier arrangements wherein the inverting and non-inverting input terminals $\overline{\text{IN}}$ and IN are connected directly to the end of $R_1$ remote from the emitter of $Q_3$ and directly to the end of $R_2$ remote from the emitter of $Q_4$, respectively, with $Q_1$ and $Q_2$ being dispensed with, may use the present invention to speed-up the slew rate exhibited by the resulting input stage.

Improving the slew rate in accordance with the present invention is advantageous over Hearn also in that additional sources or sinks of current responsive to $I_T$ are readily provided by slaving further transistors in parallel with $Q_{10}$ or $Q_{12}$. A source or sink of current that increases with the need for rapid slewing can be used in the driver or output stage of an operational amplifier to reduce the pull-up or pull-down time associated with changing the voltage at a node.

The present invention may be practiced using field effect transistors (FET's) in place of certain of its junction transistors and the scope of the following claims should be accordingly construed with "base electrode", "emitter electrode" and "collector electrode" being considered as also being descriptive of the gate, souce and drain electrodes, respectively, of a FET. As noted above, the present invention may be practiced using current mirror amplifiers in place of certain of its junction transistors and the scope of the following claims should be accordingly construed with "base electrode", "emitter electrode" and "collector electrode" being considered as also being descriptive of the input, common and output connections of a current mirror amplifier. The "normal transistor mode" is that mode of operation wherein there is no bottoming of the output circuit of the current amplifying device — e.g., no saturation with its attendent forward current over the collector-base junction, when the current amplifying device is a bipolar transistor.

What is claimed is:

1. A fast-slewing multi-stage amplifier having in cascade connection an input amplifier stage and at least one succeeding amplifier stage with associated capacitance, the charge on which capacitance must be changed during slewing, wherein said input amplifier stage comprises:

first and second transistors of a first conductivity type, each having a base electrode and each having emitter and collector electrodes and a principal conduction path therebetween;

means for applying first and second input potentials to the emitter electrode of said first transistor and to the emitter electrode of said second transistor, respectively, said input potentials having respective quiescent levels;

means for applying collector potentials to said first and said second transistors for conditioning them to operate in the normal transistor mode, including means for applying the collector current variations of said first transistor to the amplifier stage in said cascade connection immediately succeeding said input amplifier stage;

means for applying quiescent base potentials to said first and second transistors that differ respectively from the quiescent levels of the input potentials applied to their respective emitter electrodes so as to cause quiescent conduction of said first and second transistors;

a first resistor connected to sense the flow of current through the principal conduction path of said first transistor for developing a potential drop across said first resistor proportional to the current it senses, which potential drop has a quiescent value dependent upon the level of quiescent conduction of said first transistor; and first slew-rate improvement means, responsive to decrease in the potential drop across said first resistor from its quiescent value, for increasing the difference between the potential applied to the base electrode of said second transistor and the quiescent level of the input potential applied to the emitter electrode of said second transistor, thereby to increase the flow of current through the principal conduction path of said second transistor.

2. A fast-slewing multi-stage amplifier as set forth in claim 1 wherein said means for applying quiescent base potentials to said first and said second transistors and said first slew-rate improvement means together comprise:
   third and fourth transistors of said first conductivity type, each having base and emitter and collector electrodes;
   means connecting said third and said fourth transistors in long-tailed pair configuration, including
   means applying the potential drop across said first resistor between the base electrodes of said third and said fourth transistors, and including
   a constant current generator connected to an interconnection between the emitter electrodes of said third and said fourth transistors for supplying the emitter currents of said third and said fourth transistors; and
   an inverting amplifier having an input connection to the collector electrode of said third transistor and having an output connection with an interconnection between the base electrodes of said first and said second transistors.

3. A fast-slewing multi-stage amplifier as set forth in claim 1 having:
   a second resistor connected to sense the flow of current through the principal conduction path of said second transistor for developing a potential drop across said second resistor proportional to the current it senses, which potential drop has a quiescent value dependent upon the level of quiescent conduction of said second transistor; and
   second slew-rate improvement means, responsive to decrease in the potential drop across said second resistor from its quiescent value, for increasing the difference between the potential applied to the base electrode of said first transistor and the quiescent level of the input potential applied to the emitter electrode of said first transistor, thereby to increase the flow of current through the principal conduction path of said first transistor.

4. A fast-slewing multi-stage amplifier having an input amplifier stage and at least one succeeding amplifier stage with associated capacitance, the charge on which capacitance must be changed during slewing, wherein said input amplifier stage comprises:
   first and second resistors each having first and second ends;
   means for applying respective potentials to the first ends of said first and said second resistors, which potentials have quiescent values;
   first and second transistors of a first conductivity type having respective emitter electrodes connected to the second ends respectively of said first resistor and of said second resistor, having respective base electrodes with an interconnection therebetween, and having respective collector electrodes;
   means for applying collector potentials to said first and said second transistors for conditioning them to operate in the normal transistor mode, including means for applying the collector current variations of said first transistor to the amplifier stage immediately succeeding said input amplifier stage;
   means for applying a quiescent potential to said interconnection between the base electrodes of said first and said second transistors of a value differing from the quiescent values of the respective potentials applied to the first ends of said first and second resistors to cause respective quiescent emitter current flows in said first and said second transistors, whereby quiescent potential drops across said first and said second resistors are developed responsive to the quiescent emitter currents of said first and said second transistors respectively;
   first slew-rate improvement means, responsive to the potential drop across said second resistor decreasing from its quiescent value, for increasing the difference between the potential at the interconnection of the base electrodes of said first and said second transistors and said quiescent potential at the first end of said first resistor, thereby to increase the flow of emitter current in said first transistor.

5. A fast-slewing multi-stage amplifier as set forth in claim 4 wherein said means for applying respective potentials to the first ends of said first and said second resistors includes:
   third and fourth transistors of a second conductivity type complementary to said first conductivity type, each having base and emitter and collector electrodes;
   inverting and non-inverting input signal terminals connected to separate ones of the base electrodes of said third and said fourth transistors;
   means for applying collector potentials to said third and said fourth transistors for conditioning them to operate in the normal transistor mode;
   a connection of the emitter electrode of said third transistor to the first end of said first resistor; and
   a connection of the emitter electrode of said fourth transistor to the first end of said second resistor.

6. A fast-slewing multi-stage amplifier as set forth in claim 4 wherein said means for applying a quiescent potential to said interconnection between the base electrodes of said first and said second transistors and said first slew-rate improvement means together include:
   third and fourth transistors of said first conductivity type, having respective base electrodes respectively connected to the first end of said second resistor and to the second end of said second resistor, and having respective emitter electrodes and respective collector electrodes;
   means connecting said third and fourth transistors in long-tailed pair configuration, including
   a constant current generator connected to an interconnection between the emitter electrodes of said third and said fourth transistors for supplying the emitter currents of said third and said fourth transistors; and
   an inverting amplifier having an input connection to the collector electrode of said third transistor and having an output connection with the interconnection between the base electrodes of said first and said second transistors.

7. A fast-slewing multi-stage amplifier as set forth in claim 4 wherein said means for applying a quiescent potential to said interconnection between the base electrodes of said first and said second transistors and said first slew-rate improvement means together include:

third and fourth transistors of said first conductivity type, having respective base electrodes connected respectively to the first end of said second resistor and to the interconnection between the base electrodes of said first and said second transistors, having respective emitter electrodes, and having respective collector electrodes;

semiconductor diode means connected between the emitter electrodes of said third and said fourth transistors and poled to conduct the emitter current of said fourth transistor;

a constant current generator connected to the interconnection of the emitter electrode of said third transistor with said semiconductor diode means for supplying the emitter currents of said third and said fourth transistors;

means applying collector potential to said fourth transistor for conditioning it to operate in the normal transistor mode; and an inverting amplifier having an input connection to the collector electrode of said third transistor and having an output connection with the interconnection between the base electrodes of said first and said second transistors.

8. A fast-slewing multi-stage amplifier as set forth in claim 4 wherein said means for applying a quiescent potential to said interconnection between the base electrodes of said first and said second transistors and said first slew-rate improvement means together include:

a third transistor of said first conductivity type having a base electrode connected to the first end of said second resistor and having emitter and collector electrodes;

a constant current generator connected to the emitter electrode of said third transistor, for providing a current of a polarity to cause emitter current flow in said third transistor;

first and second semiconductor diode means, connected serially between the emitter electrode of said third transistor and the interconnection between the base electrodes of said first and said second transistors, and poled to tend to conduct a portion of the current from said current generator; and an inverting amplifier having an input connection to the collector electrode of said third transistor and having an output connection to the interconnection between the base electrodes of said first and said second transistors.

9. A fast-slewing multi-stage amplifier as set forth in claim 4 including:

second slew-rate improvement means, responsive to the potential drop across said first resistor decreasing from its quiescent value, for increasing the difference between the potential at the interconnection of the base electrodes of said first and said second transistors and said quiescent potential at the first end of said second resistor, thereby to increase the flow of emitter current in said second transistor.

10. A fast-slewing multi-stage amplifier as set forth in claim 9 wherein said means for applying a quiescent potential to said interconnection between the base electrodes of said first and second transistors, said first slew-rate improvement means, and said second slew-rate improvement means together include:

third and fourth and fifth and sixth transistors of said first conductivity type, having respective base electrodes connected to the first end of said first resistor, the second end of said first resistor, the first end of said second resistor, and the second end of said second resistor, respectively, and having respective emitter electrodes, and respective collector electrodes;

means connecting said third and said fourth transistors in a first long-tailed pair configuration, including a first constant current generator connected to an interconnection between the emitter electrodes of said third and said fourth transistors for supplying the emitter currents of said third and said fourth transistors;

means connecting said fifth and sixth transistors in a second long-tailed pair configuration, including a second constant current generator connected to an interconnection between the emitter electrodes of said fifth and said sixth transistors for supplying the emitter currents of said fifth and said sixth transistors, respectively, and an inverting amplifier having an input connection to which the collector electrodes of said third and said fifth transistors connect and having an output connection with the interconnection between the base electrodes of said first and said second transistors.

11. A fast-slewing multi-stage amplifier as set forth in claim 10 wherein said inverting amplifier exhibits a relatively low gain between its input and output connections when a quiescent level of current is received at its input connection and relatively high gain between its input and output connections when a level of current substantially larger than said quiescent level is received at its input connection.

12. A fast-slewing multi-stage amplifier as set forth in claim 10 wherein the collector electrodes of said fourth and said sixth transistors are connected to the output connection of said inverting amplifier.

13. A fast-slewing multi-stage amplifier as set forth in claim 9 wherein said means for applying a quiescent potential to said interconnection between the base electrodes of said first and second transistors, said first slew-rate improvement means, and said second slew-rate improvement means together include:

third and fourth and fifth and sixth transistors of said first conductivity type, having respective base electrodes connected to the first end of said first resistor, the second end of said first resistor, the first end of said second resistor, and the second end of said second resistor, respectively, and having respective emitter electrodes, and respective collector electrodes;

a constant current generator connected to an interconnection to which the emitter electrodes of said third and said fourth and said fifth and said sixth transistors connect for supplying the emitter currents of said third and said fourth and said fifth and said sixth transistors;

means for applying collector potentials to said fourth and said sixth transistors for conditioning each to operate in the normal transistor mode; and an inverting amplifier having an input connection to which the collector electrodes of said third transistors and said fifth transistor connect and having an output connection with the interconnection between the base electrodes of said first and said second transistors.

14. A fast-slewing multi-stage amplifier as set forth in claim 13 wherein said inverting amplifier exhibits a relatively low gain between its input and output connections when a quiescent level of current is received at its input connections when a quiescent high gain between its input and output connections when a level of current substantially larger than said quiescent level is received at its input connections.

15. A fast-slewing multi-stage amplifier as set forth in claim 13 wherein said means for applying collector potentials to said fourth and said sixth transistors includes connections of the collector electrodes of said fourth and said sixth transistors to the output connection of said inverting amplifier.

16. A flast-slewing multi-stage amplifier as set forth in claim 9 wherein said means for applying a quiescent potential to said interconnection between the base electrodes of said first and second transistors, said first slew-rate improvement means, and said second slew-rate improvement means together include:
   third and fourth and fifth transistors of said first conductivity type having respective base electrodes connected to the first end of said first resistor, to the first end of said second resistor and to the interconnection between the base electrodes of said first and said second transistors, respectively, and having respective emitter electrodes and respective collector electrodes;
   semiconductor diode means connected between the emitter electrode of said fifth transistor and an interconnection between the emitter electrodes of said third and said fourth transistors and poled to conduct the emitter current of said fifth transistor;
   a constant current generator connected to the interconnection of the emitter electrodes of said third and said fourth transistors for supplying the emitter currents of said third and said fourth and said fifth transistors;
   means applying collector potential to said fifth transistor for conditioning it to operate in the normal transistor mode; and
   an inverting amplifier having an input connection to which the collector electrodes of said third and said fourth transistors connect and having an output connection with the interconnection of said first and said second transistors.

17. A fast-slewing multi-stage amplifier as set forth in claim 16 wherein said inverting amplifier exhibits a relatively low gain between its input and output connections when a quiescent level of current is received at its input connection and relatively high gain between its input and output connections when a level of current substantially larger than said quiescent level is received at its input connection.

18. A fast-slewing multi-stage amplifier as set forth in claim 9 wherein said means for applying a quiescent potential to said interconnection between the base electrodes of said first and second transistors, said first slew-rate improvement means, and said second slew-rate improvement means together include:
   third and forth transistors of said first conductivity type having respective base electrodes respectively connected to the first end of said first resistor and to the first end of said second resistor, having respective emitter electrodes and having respective collector electrodes;
   a constant current generator connected to an interconnection between the emitter electrodes of said third and fourth transistors, for providing a current of a polarity to cause emitter current flows between said third and said fourth transistors;
   first and second semiconductor diode means, connected serially between the interconnection between the base electrodes of said first and said second transistors and the interconnection between the emitter electrodes of said third and said fourth transistors, and poled to tend to conduct a portion of the current from said current generator; and
   an inverting amplifier having an input connection to which the collector electrodes of said third and said fourth transistors connect and having an output connection to the interconnection between the base electrodes of said first and said second transistors.

19. A fast-slewing multi-stage amplifier as set forth in claim 18 wherein said inverting amplifier exhibits a relatively low gain between its input and output connections when a quiescent level of current is received at its input connection and relatively high gain between its input and output connections when a level of current substantially larger than said quiescent level is received as its input connection.

20. A fast-slewing multi-stage amplifier having in cascade connection an input amplifier stage and at least one succeeding amplifier stage with associated capacitance, the charge on which capacitance must be changed during slewing, wherein said input amplifier stage comprises:
   first and second transistors of a first conductivity type, each of said first and second transistors having a base electrode connected to receive a respective base potential, at least one of which base potentials has a signal component, and each of said first and second transistors having emitter and collector electrodes and a principal conduction path therebetween;
   third and fourth transistors of a second conductivity type complementary to said first conductivity type, each having emitter and collector electrodes and a principal conduction path therebetween, the emitter electrodes of said third and said fourth transistors being connected to the emitter electrodes of said first and said second transistors respectively;
   means applying a bias potential to the base electrodes of said third and fourth transistors for causing current flow through the principal conduction paths of said first and third transistors and for causing current flow through the principal conduction paths of said second and said fourth transistors, said means including
   means for sensing decrease in the current flow through the principal conduction path of said first and third transistors from its quiescent value for changing said bias potential to increase the difference between the base potentials of said second and fourth transistors;
   means for applying collector potentials to each of said transistors for conditioning them to operate in the normal transistor mode; and
   means for coupling the collector current variation of at least one of said transistors to the immediately succeeding amplifier stage in said cascade connection.

21. A fast-slewing multi-stage amplifier as set forth in claim 20 wherein said means for applying a potential to the base electrodes of said third and fourth transistors includes:
  means for sensing decrease in the current flow through the principal conduction paths of said second and fourth transistors from its quiescent value for changing said bias potential to increase the difference between the base electrodes of said first and third transistors.

* * * * *